(12) United States Patent
Lendvay

(10) Patent No.: US 12,073,908 B2
(45) Date of Patent: Aug. 27, 2024

(54) ON-DIE HEATER DEVICES FOR MEMORY DEVICES AND MEMORY MODULES

(71) Applicant: Micron Technology, Inc., Boise, ID (US)

(72) Inventor: William A. Lendvay, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/675,707

(22) Filed: Feb. 18, 2022

(65) Prior Publication Data

US 2022/0293140 A1 Sep. 15, 2022

Related U.S. Application Data

(60) Provisional application No. 63/160,209, filed on Mar. 12, 2021.

(51) Int. Cl.
*G11C 5/14* (2006.01)
*H01L 23/34* (2006.01)
*H01L 23/525* (2006.01)

(52) U.S. Cl.
CPC ............ *G11C 5/148* (2013.01); *H01L 23/345* (2013.01); *H01L 23/5256* (2013.01)

(58) Field of Classification Search
None
See application file for complete search history.

(56) References Cited

U.S. PATENT DOCUMENTS

| 5,557,573 A * | 9/1996 | McClure ........ G01R 31/318511 |
| | | 365/201 |
| 6,940,774 B2 | 9/2005 | Perner |
| 7,263,633 B2 | 8/2007 | Stavrou et al. |
| 9,148,910 B1 * | 9/2015 | Mimran ................. H05B 1/023 |
| 2002/0089874 A1 * | 7/2002 | Nickel .................... G11C 11/16 |
| | | 365/171 |
| 2019/0026238 A1 | 1/2019 | Lendvay |

FOREIGN PATENT DOCUMENTS

DE   102004022328 A1   12/2005
WO      2009058125 A2    5/2009

OTHER PUBLICATIONS

Viking Technology, "Datasheet for ECC VLP RDIMM VR9VRxx72x8xxx", Revision C, Mar. 10, 2017, 42 pages.

\* cited by examiner

*Primary Examiner* — J. H. Hur
(74) *Attorney, Agent, or Firm* — TraskBritt

(57) ABSTRACT

A memory device includes at least one die and a heater device. The heater device includes a first switch element electrically connected to a power supply connection and the at least one die, a second switch element electrically connected to the first switch element, and a resistive element electrically connected to the second switch element and a ground connection. A method includes configuring the first switching element of the heater device to electrically connect the second switching element of the heater device to a power supply connection, configuring the second switching element to electrically connect one of a first resistor or a second resistor of the resistive element to the first switching element, and applying a voltage across the first resistor or the second resistor that is electrically connected to the first switching element.

38 Claims, 7 Drawing Sheets

ON-DIE HEATER DEVICES FOR MEMORY DEVICES AND MEMORY MODULES

CROSS-REFERENCE TO RELATED APPLICATION

This application claims the benefit under 35 U.S.C. § 119(e) of U.S. Provisional Patent Application Ser. No. 63/160,209, filed Mar. 12, 2021, the disclosure of which is hereby incorporated herein in its entirety by this reference.

FIELD

Embodiments of the disclosure relate generally to heater devices for microelectronic devices to emulate operating conditions of a given system incorporating such microelectronic devices, microelectronic devices incorporating such heater devices, modules including such microelectronic devices, methods of using heating devices to emulate operating conditions of such microelectronic devices to predict the effects of such conditions on a given system utilizing same, and related systems and methods.

BACKGROUND

Microelectronic devices in the form of semiconductor die are conventionally formed in large area wafers and other bulk substrates such that hundreds or thousands of identical individual die are simultaneously fabricated. Such die may comprise diodes, transistors, metal-oxide semiconductor field-effect transistors, insulated-gate bipolar transistors, etc. Semiconductor die are utilized in various memory devices (e.g., conventional volatile memory, such as conventional dynamic random access memory (DRAM)), alone and in assemblies incorporating control logic die (e.g., hybrid memory cubes (HMCs) and host (e.g., processor) devices, e.g., high bandwidth memory (HBM) devices and in conventional non-volatile memory, such as conventional NAND and/or NOR memory). Such memory devices are utilized within memory modules of computing systems (e.g., desktop computers, laptops, servers, mobile devices, etc.). Such systems also incorporate other, different functionalities of semiconductor die, such as microprocessor configured central processing units (CPUs), as well as die incorporating both processing and memory functionalities, such as graphics processing units (GPUs) and application specific integrated circuits (ASICs).

DETAILED DESCRIPTION

Figure 1:
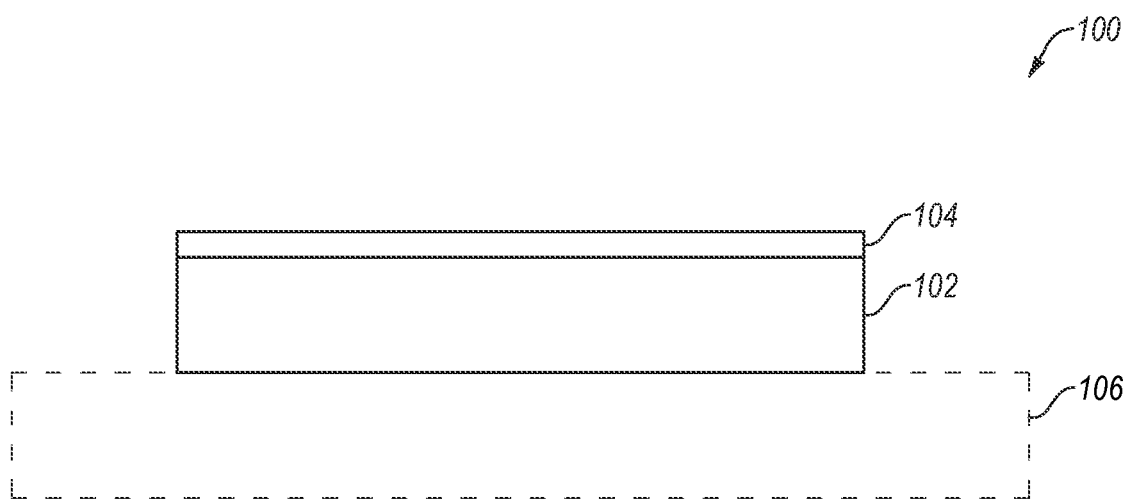
FIG. 1 shows a schematic diagram of a memory device including a die, a heater device, and an optional package substrate according to one or more embodiments of the disclosure.

The illustrations presented herein are not actual views of any particular heater device, memory device, or memory module but are merely idealized representations employed to describe example embodiments of the disclosure. The following description provides specific details of embodiments of the disclosure in order to provide a thorough description thereof. However, a person of ordinary skill in the art will understand that the embodiments of the disclosure may be practiced without employing many such specific details. Indeed, the embodiments of the disclosure may be practiced in conjunction with conventional techniques employed in the industry. In addition, the description provided below does not include all elements to form a complete structure or assembly. Only those process acts and structures necessary to understand the embodiments of the disclosure are described in detail below. Additional conventional acts and structures may be used. Also note, any drawings accompanying the application are for illustrative purposes only, and are thus not drawn to scale. Additionally, elements common between figures may have corresponding numerical designations.

As used herein, the terms "comprising," "including," and grammatical equivalents thereof are inclusive or open-ended terms that do not exclude additional, un-recited elements or method steps, but also include the more restrictive terms "consisting of," "consisting essentially of," and grammatical equivalents thereof.

As used herein, the term "may" with respect to a material, structure, feature, or method act indicates that such is contemplated for use in implementation of an embodiment of the disclosure, and such term is used in preference to the more restrictive term "is" so as to avoid any implication that other compatible materials, structures, features, and methods usable in combination therewith should or must be excluded.

As used herein, the term "configured" refers to a size, shape, material composition, orientation, and arrangement of one or more of at least one structure and at least one apparatus facilitating operation of one or more of the structure and the apparatus in a predetermined way.

As used herein, the singular forms following "a," "an," and "the" are intended to include the plural forms as well, unless the context clearly indicates otherwise.

As used herein, the term "and/or" includes any and all combinations of one or more of the associated listed items.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "semiconductor material" refers to a material having a conductivity between those of electrically insulating materials and electrically conductive materials. For example, a semiconductor material may have a conductivity of between about $10^{-8}$ Siemens per centimeter (S/cm) and $10^4$ S/cm at room temperature (e.g., between about twenty degrees centigrade and about twenty-five degrees centigrade). Examples of semiconductor materials include elements found in column IV of the period table of elements such as silicon (Si), germanium (Ge), and carbon (C). Other examples of semiconductor materials include compound semiconductor materials such as binary compound semiconductor materials (e.g., gallium arsenide (GaAs)), ternary compound semiconductor materials (e.g., $Al_xGa_{1-x}As$), and quaternary compound semiconductor materials (e.g., $Ga_xIn_{1-x}As_yP_{1-y}$), without limitation. Compound semiconductor materials may include combinations of elements from columns III and V of the period table of elements (III-V semiconductor materials) or from columns II and VI of the period table of elements (II-VI semiconductor materials), without limitation. Semiconductor devices often include crystalline semiconductor materials. By way of non-limiting examples, transistors and diodes include crystalline semiconductor materials.

As used herein, the term "monocrystalline semiconductor material" refers to a semiconductor material including particles (e.g., atoms, molecules) that are arranged in a substantially continuous crystal lattice that is substantially free of grain boundaries within the semiconductor material. A substrate of a semiconductor material may include a monocrystalline semiconductor material such as single-crystal silicon. A substrate including monocrystalline semiconductor material may serve as a substrate material for various devices and structures disclosed herein.

As used herein, the term "polycrystalline semiconductor material" refers to a semiconductor material including multiple crystals, sometimes known as crystallites or grains, of the semiconductor material. In contrast with monocrystalline semiconductor material, polycrystalline semiconductor material includes grain boundaries within the semiconductor material. Polycrystalline silicon, which is also known as "polysilicon" and "poly," is an example of a polycrystalline semiconductor material.

As used herein, the term "doped semiconductor material" refers to a semiconductor material having a higher concentration of impurities (e.g., dopants) introduced thereto than intrinsic semiconductor materials (e.g., a higher concentration of impurities than electron and hole concentrations resulting from thermal generation at room temperature). A doped semiconductor material may be doped predominantly with donor impurities such as phosphorus (P), antimony (Sb), bismuth (Bi), or arsenic (As), without limitation. Each donor impurity in a crystal lattice of semiconductor material adds a free electron, which increases the conductivity of the semiconductor material relative to the intrinsic form of the semiconductor material. Doped semiconductor materials that have been doped predominantly with donor impurities are referred to herein as "N-type semiconductor materials." A doped semiconductor may instead be doped predominantly with trivalent or acceptor impurities such as boron (B), indium (In), aluminum (Al), and gallium (Ga), without limitation. Each trivalent or acceptor impurity in a crystal lattice of semiconductor material adds an electron hole (referred to herein as "hole"), which increases the conductivity of the semiconductor material relative to the intrinsic form of the semiconductor material. Doped semiconductor materials that have been doped predominantly with trivalent or acceptor impurities are referred to herein as "P-type semiconductor materials."

As used herein, the terms "vertical" and "horizontal" refer to directions that are substantially perpendicular and parallel, respectively, to a surface of a substrate on or in which semiconductor devices are formed. For example, a "vertical" stack of materials or a "vertically oriented" stack of materials on a substrate refers to a stack of materials in which a first material is between the substrate and a second material, the first material and the second material are between the substrate and the third material, and so on so that each successive material is further from the substrate than the previous material. By contrast, a "horizontal" stack of materials or a "horizontally oriented" stack of materials refers to a stack of materials in which boundaries between the materials are each substantially the same distance from the substrate. As used herein, the term "wafer" means and includes materials upon which and in which structures including feature dimensions of micrometer and nanometer scale are partially or completely fabricated. Such materials include conventional semiconductor (e.g., silicon) wafers, as well as bulk substrates of other semiconductor materials as well as other materials. For the sake of convenience, such materials will be referenced below as "wafers." Example structures formed on such materials may include, for example, integrated circuitry (active and passive), MEMS devices, and combinations thereof.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND and/or NOR memory), but also includes an application specific integrated circuit (ASIC) (e.g., a system on a chip (SoC)), a microelectronic device combining logic and memory, and a graphics processing unit (GPU) incorporating memory.

As used herein, the term "module" means and includes assemblies of one or more microelectronic devices (e.g., semiconductor die) mounted and operative coupled to a substrate. Non-limiting examples of modules include one or more volatile and non-volatile memory devices in combination, optionally with logic mounted to a substrate (e.g., circuit board) for interaction with higher-level packaging (e.g., a motherboard).

When developing, manufacturing, testing, and/or implementing systems (e.g., computing devices (e.g., laptops, desktop computers, servers, computer clusters, etc.) having processing devices), designers, manufacturers, and operators (referred to hereinafter collectively as "operators") of the systems typically want to determine and/or analyze (e.g., test) power and thermal operating conditions of the systems prior to obtaining one or more components of the systems (e.g., an ASIC, a memory controller, etc.) or predict the effects of such power and thermal operating conditions during the design process. For example, the operators typically want to measure heat generated by various components during operation of the system for an anticipated power draw and associated processing load and to test thermal effects to predict, design and implement the desirability of heat sinks, fans or other methods of controlling temperatures of the system for the anticipated power draw and associated processing load. Additionally, the operators may want to determine and/or analyze (e.g., test) power and thermal operating conditions of the systems for upcoming, but not yet available microelectronic devices, for example memory devices (e.g., a next generation of dynamic access memory (DRAM)). As non-limiting examples, the operators may want to test for parameters such as power delivery, air flow, heat dissipation, etc., affected by upgrades or other changes in memory devices for their given or proposed system and structure. Furthermore, the operator may want to test power delivery, air flow, heat dissipation, etc., prior to finalizing the system's design (e.g., to inform the design (e.g., determine how close memory devices can be positioned next to each other while still operating within given airflow and thermal constraints of the system package)).

Conventionally, software simulations and models have been utilized to model airflow, heat generation, and power delivery; however, actual hardware testing can be more compelling and can provide more accurate data. In an attempt to mimic physical conditions of systems, previous methods of physical testing of power and thermal conditions of a memory device include building physical heater packages (e.g., mere packages having a fixed resistance) based at least partially on some parameters of a given system, and a varying voltage that is applied to the heater package to elevate the temperature of the package. The heater package is then placed in a wind tunnel to test how the heater package cools responsive to given air flows. Resulting data can be provided to the operators, who in turn can apply that data to their own system. However, the data is not always sufficiently specific to the operators' systems and typically do not model other factors (e.g., the presence of other components, cross-sections of air flow areas through system packages, heat transfer capabilities or constraints of module substrates or mother boards, or other limitations) of the operators' systems which can influence power and thermal operating conditions of the operators' systems. Furthermore, building the physical heater packages for every anticipated system is time consuming, relatively expensive, and are not specific to each proposed installation.

Embodiments of the disclosure include, for example, a memory device having a heater device comprising a resistive element (e.g., a built in resistive element) that can be utilized to emulate operational power consumption and heat generation of the memory device without operation of the device. For example, embodiments of the disclosure include memory devices (e.g., DRAM, NAND, NOR) that include resistive elements formed therein or thereon. Furthermore, the memory devices include switching circuitry and/or fuses that allow the memory device to exhibit a pure resistive load. By providing a pure resistive load, the memory devices may be utilized to draw anticipated operational current amounts (e.g., nominal or max current) and generate heat to emulate anticipated operating conditions. As a result, the memory devices may emulate anticipated power and thermal operating conditions prior to a system being complete and operational, or having a suitable memory controller available. Additionally, the memory devices may emulate anticipated power and thermal operating conditions prior to assigned or given processing loads. For instance, the memory devices may be mounted to memory modules and utilized in intended system (e.g., desktop, laptop, server) environments. As a result, the heater device of the memory device permits power conditions and thermal conditions of the system to be emulated and tested without requiring additional software or customized testing systems. There-fore, the power and thermal conditions of the system can be measured and tested on site by the operators of the system. Moreover, the heater device of the memory device permits an operator to adjust (e.g., fine tune) operating parameters (e.g., fan speeds, airflow, etc.) and/or structure (e.g., heat sinks, etc.) of the system based on the emulated power and thermal conditions without having a complete system and/or prior to having a fully functioning system.

FIG. 1 is a schematic diagram of a memory device 100 including a die 102 (e.g., a die formed from a wafer) and a thermal and heat testing device 104. In some embodiments, the memory device 100 may optionally include a package substrate 106 according to one or more embodiments of the disclosure. For example, the memory device 100 may include any of the memory devices described above (e.g., DRAM, NAND, NOR, etc.) and may include any conventional functional design of die 102 associated and/or conventionally utilized with any of the above-described memory devices. As noted above, the memory device 100 may include the thermal and heat testing device 104 (referred to hereinafter as a "heater device 104"). In some embodiments, the heater device 104 may be disposed on and/or within the die 102 (e.g., a die stack) of the memory device 100. For example, the heater device 104 may be disposed between a wafer material of the die 102 and a logic die material or processing die material to which the die 102 may be associated during actual system operation. Additionally, the heater device 104 may be formed within a metallization (e.g., back end of line (BEOL) metallization) of the die 102. In some embodiments, the heater device 104 may be located on or in an active surface of the die 102 peripheral to a memory array of the at least one die. Alternatively, the heater device 104 may be separately fabricated and disposed on a top of the die 102, for example in the form of a portion of a redistribution layer (RDL) or interposer for rerouting pinouts of die 102. In further embodiments, the die 102 may be disposed on the package substrate 106, and the heater device 104 may be disposed on the package substrate 106 and may be at least partially separated from the die 102. The location and form of the heater device 104 are described in greater detail below in regard to FIGS. 2 and 3.

As is discussed in greater detail below, the memory device 100 may include a system-ready component. For example, the memory device 100 may be ready to be coupled to a memory controller (e.g., a motherboard) and utilized with a system (e.g., a desktop computer). Put another way, the memory device 100 equipped with a heater device 104 may be a "plug and play" component. Furthermore, as is described in greater detail below, the heater device 104 may enable an operator of the system to temporarily and without operation of the memory device 100, turn the memory device 100 into a resistive element, provide power to the resistive element, and readily test power and thermal conditions of the system affected by the powered resistive element without requiring a complete system or even a memory controller to be available. For instance, the heater device 104 of the memory device 100 may be utilized to draw and consume selected energy (e.g., current, voltage) amounts, which may be selected based on anticipated processing loads (e.g., active power and/or standby power) and generate heat. Therefore, the heater device 104 may emulate typical operating power draws and typical operational heat generation (e.g., thermal environment) that the system will cause and experience during operation (e.g., will cause and experience during operation due to processing requirements (i.e., high processing functions)). Furthermore, the heater device 104 may emulate the power and thermal conditions of the system prior to having a complete system or having particular memory controllers or other components available to direct processing functions. Furthermore, the heater device 104 of the memory device 100 permits power conditions and thermal conditions of the system to be emulated and tested without requiring additional software or custom testing systems.

Figure 2:
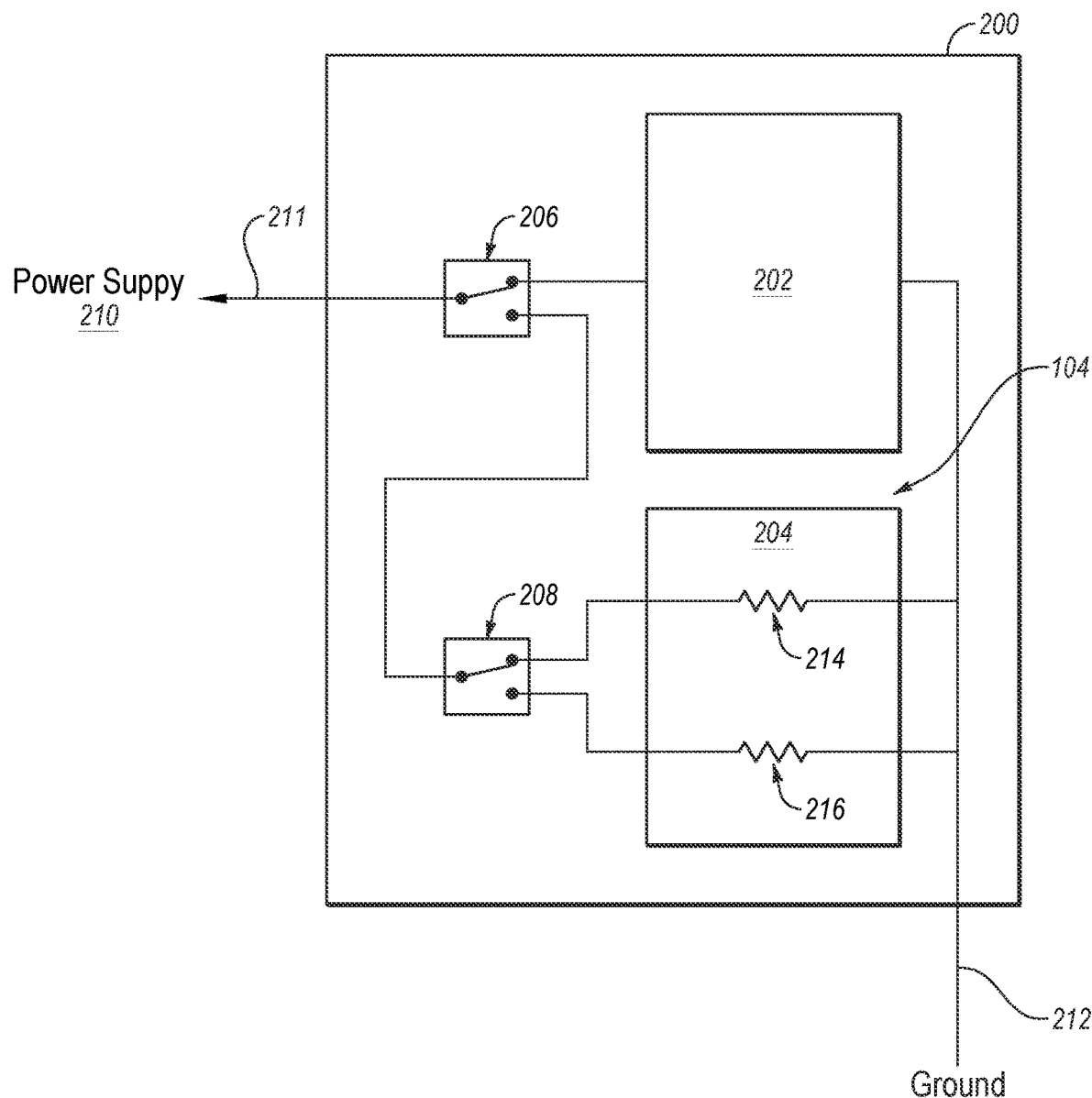
FIG. 2 shows a schematic diagram of a memory device including a heater device according to one or more embodiments of the disclosure.

FIG. 2 is a schematic diagram of a memory device 200 including a heater device 104 according to one or more embodiments of the disclosure. The memory device 200 may include at least one die 202 (e.g., a body of semiconducting material (e.g., a silicon die)) and the heater device 104. The heater device 104 may include a resistive element 204, a first switch element 206, a second switch element 208, a power supply connection 211, and a ground connection 212. The at least one die 202 may include any conventional die utilized in memory devices (e.g., a typical die of DRAM, NAND, NOR memories). The power supply connection 211 may be configured to be electrically connected to a power supply 210 when the memory device 200 is mounted to a substrate such as a memory module, which is installed within a system (e.g., a desktop or laptop computer, tablet, smartphone, etc.). As noted above, in one or more embodiments, the resistive element 204 of the heater device 104 may be disposed on or within the at least one die 202, and in other embodiments, the resistive element 204 of the heater device 104 may be separate from the at least one die 202 and located elsewhere (e.g., RDL, interposer) within the memory device 200.

In some embodiments, the resistive element 204 may include a first resistor 214 and a second resistor 216, and the first and second resistors 214, 216 may exhibit differing resistances relative to each other. For example, in some embodiments, the first resistor 214 may exhibit a resistance of about 4.0 ohms (Ω), and the second resistor 216 may exhibit a resistance of about 24.0 ohms (Ω). Although specific resistances are described herein, the disclosure is not so limited; rather, the first and second resistors 214, 216 may each include resistances within a range of about 0.5 ohm (Ω) and about 30.0 ohms (Ω). As is described in further detail below, in some embodiments, the first resistor 214 may exhibit a selected resistance to emulate an active power status of the system (e.g., a relatively higher processing load), and the second resistor 216 may exhibit a selected resistance to emulate a standby power status of the system (e.g., a relatively lower processing load). Furthermore, in some embodiments, the resistive element 204 may include only one resistor exhibiting a resistance within a range described above. In alternative embodiments, the resistive element 204 may include more than two available resistances, for example, three, four, five, ten, or more resistors having differing resistances.

In some embodiments, the power supply 210 may include a voltage supply in the form of $V_{DD}$, a power pin of a memory module, a positive voltage power, a drain supply, or any other conventional power supply 210 of a memory module. As will be understood by one of ordinary skill in the art, the power supply 210 may be, and conventionally is, separate from the memory device 200. In some embodiments, the power supply 210 may be configured to provide voltages within a range of about 0.8 V to about 2.5 V via the power supply connection 211. Furthermore, the voltages provided by the power supply 210 may be selectable (i.e., the power supply may be variable).

In some embodiments, the first switch element 206 may be electrically connected to the power supply connection 211, the at least one die 202, and the second switch element 208. In other words, the heater device 104 may include electrical connections between the power supply connection 211 and the first switch element 206, between the first switch element 206 and the at least one die 202, and between the first switch element 206 and the second switch element 208. Likewise, the second switch element 208 may be electrically connected to the first switch element 206 and the resistive element 204, which, in turn, may be electrically connected to the ground connection 212. For instance, the heater device 104 may include electrical connections between the second switch element 208 and the resistive element 204 and electrical connections between the resistive element 204 and the ground connection 212.

Generally, the first switch element 206 may be configured to switch between electrically connecting the at least one die 202 to the power supply connection 211 while creating an open circuit with the resistive element 204 and electrically connecting the resistive element 204 to the power supply 210 while creating an open circuit with the at least one die 202. Additionally, when the memory device 200 is coupled to a memory module (e.g., a double data rate (DDR) 4 memory module) and the memory module is coupled to a memory controller ((e.g., a memory controller of a motherboard (e.g., an integrated memory controller (IMC), a memory chip controller (MCC), a memory controller unit (MCU), a memory management unit (MMU), etc.))), the first switch element 206 may be configured to be operably coupled to the memory controller of the system, such that operation of the first switch element 206 may be effectuated by and/or through the memory controller. For example, the memory device 200 may form part of an unregistered memory module. In other embodiments, the memory device 200 may be installed within a registered memory module (described below), and the first switch element 206 may be configured to be operably coupled to a register of a memory module, such that operation of the first switch element 206 may be effectuated by or through the register.

As a non-limiting example, in some embodiments, the first switch element 206 may include a fuse element and a fuse device, which is configured to blow the fuse element such that the first switch element 206 exhibits a "blown fuse configuration." In some embodiments, the fuse element may include one or more of a fuse (e.g., a laser-fusible links including polysilicon or a metal that is covered by a uniform dielectric material, such as silicon dioxide) or an electrical antifuse (e.g., a capacitor fuse exhibiting a high impedance or an open circuit that can be blown when a relatively high voltage is applied across capacitor plates of the capacitor). For example, an antifuse operates as an open circuit when fabricated. By applying a large voltage to the antifuse structure, the antifuse becomes "programmed." A programmed antifuse operates as a conductor or link in a closed circuit, allowing current to flow through that part of a circuit. In comparison, a fuse operates as a link in a closed circuit when fabricated. The fuse may be fabricated and selectively melted by methods well known to one skilled in the art, such as by an electric current or laser. Once the fuse is melted, it operates as an open circuit. Alternatively, the fuse element may include a polymeric positive temperature coefficient (PPTC) thermistor or a thermal fuse. For example, the first switch element 206 may include any conventional fuse element and fuse device.

In operation, in some embodiments, in order to "flip" the first switch element 206 to electrically connect the resistive element 204 to the power supply 210, the fuse device may apply a direct current pulse of a relatively high current (e.g., 10 mA) to blow (e.g., open) the fuse. For example, the fuse may be blown via any conventional manner. Blowing the fuse may create a relatively high resistance or create an open circuit between the at least one die and the power supply 210, which in turn may electrically connect the resistive element 204 to the power supply 210 or at least direct an energy (e.g., voltage) supplied by the power supply 210 to the resistive element 204.

In additional embodiments, the first switch element 206 may include switching circuitry configured to switch between electrically connecting the at least one die 202 to the power supply connection 211 while creating an open circuit with the resistive element 204 and electrically connecting the resistive element 204 to the power supply connection 211 while creating an open circuit with the at least one die 202 responsive to input and/or write commands. For example, the first switch element 206 may be configured to receive and/or be controlled via mode register set (MRS) commands and/or chip select or select pin commands from a memory controller. For example, the MRS commands and/or chip select or select pin commands may include configuration commands to switch (e.g., configure) the first switch element 206 between electrically connecting the at least one die 202 to the power supply connection 211 while creating an open circuit with the resistive element 204 and electrically connecting the resistive element 204 to the power supply connection 211 while creating an open circuit with the at least one die 202.

As noted above, the second switch element 208 may be electrically connected to the first switch element 206 and electrically connected to the resistive element 204. Furthermore, the resistive element 204 may be electrically connected to the ground connection 212. In some embodiments, the second switch element 208 may be operably coupled to both the first resistor 214 and the second resistor 216 and include switching circuitry be configured to switch back and forth between electrically connecting the first resistor 214 to the first switch element 206 and electrically connecting the second resistor 216 to the first switch element 206 responsive to receiving input and/or write commands. For instance, the second switch element 208 may be configured to receive and/or be controlled via MRS commands and/or chip select or select pin commands from a memory controller. For example, the second switch element 208 may be configured to electrically connect the power supply 210 to the first resistor 214 responsive to a first MRS command and/or chip select or select pin command and to electrically connect the power supply 210 to the second resistor 216 responsive to a second MRS command and/or chip select or select pin command.

As mentioned above, the heater device 104 may be utilized to test power and thermal operating conditions of a system within which the memory device 200 may be utilized. For instance, the heater device 104 may be utilized to emulate power consumption and heat generation that is anticipated within the system during operation. Therefore, during operation and during an emulation of the power and thermal conditions, the first switch element 206 may be switched (e.g., configured) to electrically connect the power supply connection 211 (and power supply 210) to the second switch element 208, and the second switch element 208 may be switched (e.g., configured) to electrically connect the power supply connection 211 (and power supply 210) to one of the first or second resistors 214, 216. In some embodiments, which resistor of the first or second resistors 214, 216 that is selected and electrically connected to the power supply 210 may be based on whether the test is intended to emulate an active power mode or a standby power mode of the system.

A voltage may be provided by the power supply 210 via the power supply connection 211; furthermore, the voltage provided by the power supply 210 may be dependent on a power mode (e.g., an active power mode or a standby power mode) being tested. As a result, the voltage may be applied across the first resistor 214 or the second resistor 216, power may be consumed, and heat generated emulating (e.g., mimicking) operation of the memory device 200 within the system. Moreover, as is discussed in greater detail below, based on the heat generated via the resistive element 204, an operator of the system may observe and measure power and thermal operating conditions of the system when operating at one or more of the power modes of the memory device 200. Furthermore, as is discussed in greater detail below, based on the measured power and thermal operating parameters, the operator of the system may adjust one or more operating parameters of the system, change a structure or configuration of the system or system packaging, change locations of system components and/or make other changes to a design of the system.

Figure 3A:
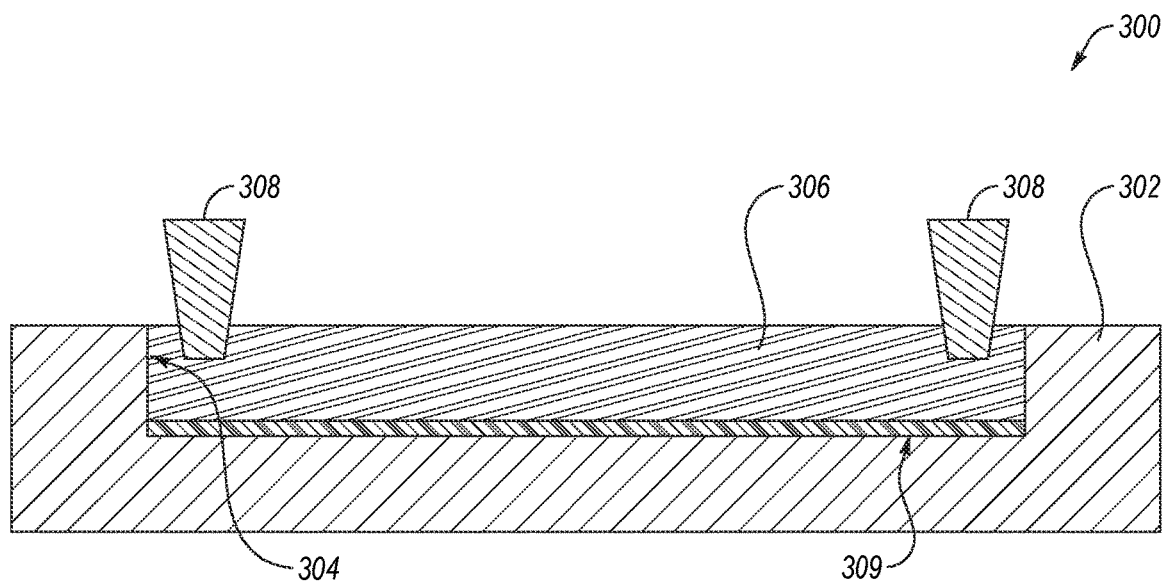
FIG. 3A shows a schematic cross-sectional view of a resistor according to one or more embodiments of the disclosure.
Figure 3B:
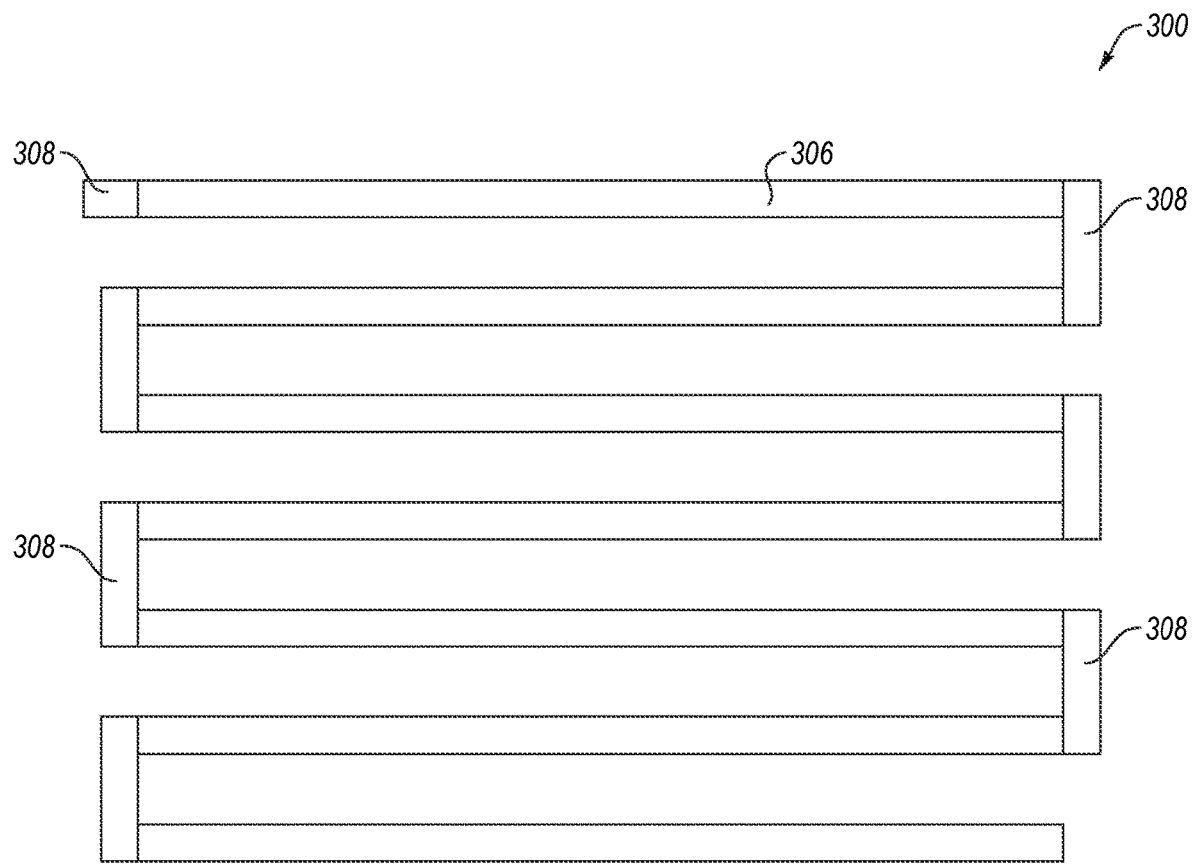
FIG. 3B shows a schematic top view of the resistor of FIG. 3A.

FIG. 3A is a schematic cross-sectional view of a resistor device 300 according to one or more embodiments of the disclosure. FIG. 3B is a schematic top view of the resistor device 300. The resistor device 300 may be formed within or on a die of a memory device (e.g., memory device 200) or elsewhere within the memory device 200. Furthermore, resistor device 300 may form a resistor (e.g., first and/or second resistor 214, 216) of a resistive element (e.g., resistive element 204) of the memory device 200.

In some embodiments, the resistor device 300 may include a substrate 302 of a die of the memory device 200 including a semiconductor material, and the substrate 302 may define a trench 304 therein. The resistor device 300 may also include an oxide material 309 and at least one electrically resistive material 306 disposed within the trench 304. As used herein, the term "electrically resistive material" refers to a material that is intended for use as an electrically resistive element of a resistor in an electronic device (e.g., an apparatus, a semiconductor device).

In one or more embodiments, the least one electrically resistive material 306 may include one or more portions oriented in series. For instance, the least one electrically resistive material 306 may form a serpentine pattern. A serpentine pattern of a resistor may be used to provide a desired length of the least one electrically resistive material 306 within a limited semiconductor chip area to achieve a desired resistance value. Resistors having this shape are sometimes known as serpentine resistors due to their laterally meandering pattern, which may resemble a serpent. A serpentine pattern may occupy a relatively large area of a semiconductor chip, which may reduce availability of the semiconductor chip area for other devices.

In some embodiments, the resistor device 300 may include multiple levels (i.e., lines) of electrically resistive materials, for example in BEOL structures or in an area of an active surface of the die peripheral to a memory array or other active circuitry, the levels stacked over each other with electrically insulating materials between the electrically resistive materials, ends of the multiple levels of electrically resistive materials coupled by conductive vias at alternating ends to provide a vertical serpentine resistor arrange. In one or more embodiments, the at least one electrically resistive material 306 may include a polycrystalline semiconductor material, such as a doped polycrystalline semiconductor material. For instance, the at least one electrically resistive material 306 may include polycrystalline silicon, such as doped polycrystalline silicon. Additionally, the electrically insulating material may include an oxide material (e.g., silicon dioxide ($SiO_2$)). In other embodiments, the at least one electrically resistive material may comprise a resistive metal material such as tungsten or tin.

Factors that influence the electrical resistance of an electrically resistive material include a cross-sectional area of the electrically resistive material, a length of the electrically resistive material, and a dopant concentration of the electrically resistive material. Accordingly, target electrical resistances of the electrically resistive material 306 may be tailored during manufacture of the resistor device 300 by considering cross-sectional areas, lengths, and dopant concentrations or metal types of the first electrically resistive material 306.

The resistor device 300 includes electrical contacts 308 electrically connected (e.g., electrically coupled) to the electrically resistive material 306. The electrical contacts 308 may include conductive materials. Electrical traces (not shown) on the resistor device 300 may be used to electrically connect to the electrical contacts 308. By way of non-limiting example, a desired total resistance of the resistor device 300 may be achieved by forming the electrically resistive material to have a desired configuration and composition.

Figure 4:
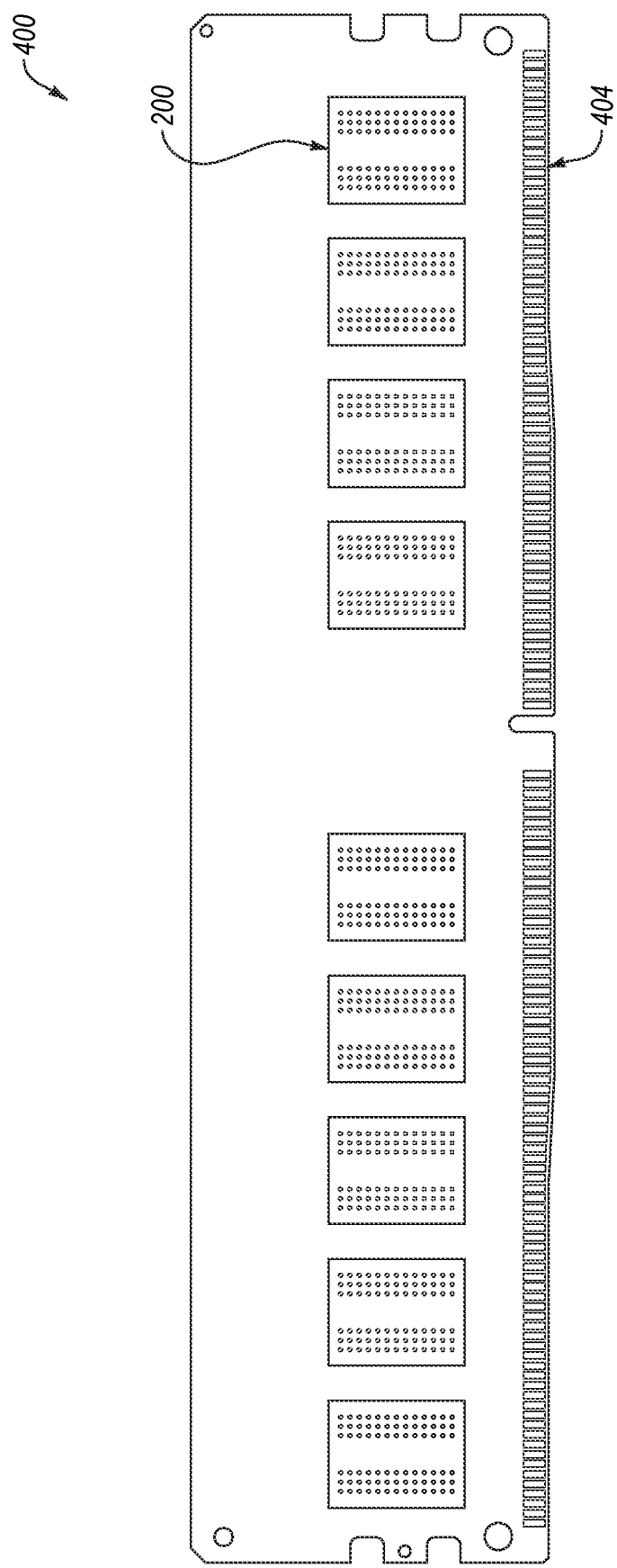
FIG. 4 shows a schematic diagram of a memory module including multiple memory devices according to one or more embodiments of the disclosure.

FIG. 4 is a schematic diagram of a memory module 400 (e.g., a RAM integrated circuit) including multiple memory devices 200 of FIG. 2. For example, the memory module 400 may include a double data rate (DDR) fourth generation Synchronous Dynamic Random-Access Memory (DDR4 SDRAM), and each of the memory device 200 may include a DRAM. The memory module 400 may further include a plurality of input/output pins 404. In embodiments including unregistered memory, each of the memory devices 200 may include a respective line (e.g., connection) that is configured to electrically connect directly to a memory controller (e.g., a memory controller of the module or a motherboard), such that the memory controller may control (e.g., drive) each of the memory devices 200. The lines (e.g., connections) may be operably coupled to one or more of the plurality of input/output pins 404. In embodiments including registered memory (e.g., buffered memory), the memory module 400 may include a register or buffer chip between the memory devices 200 and the memory controller.

Figure 5:
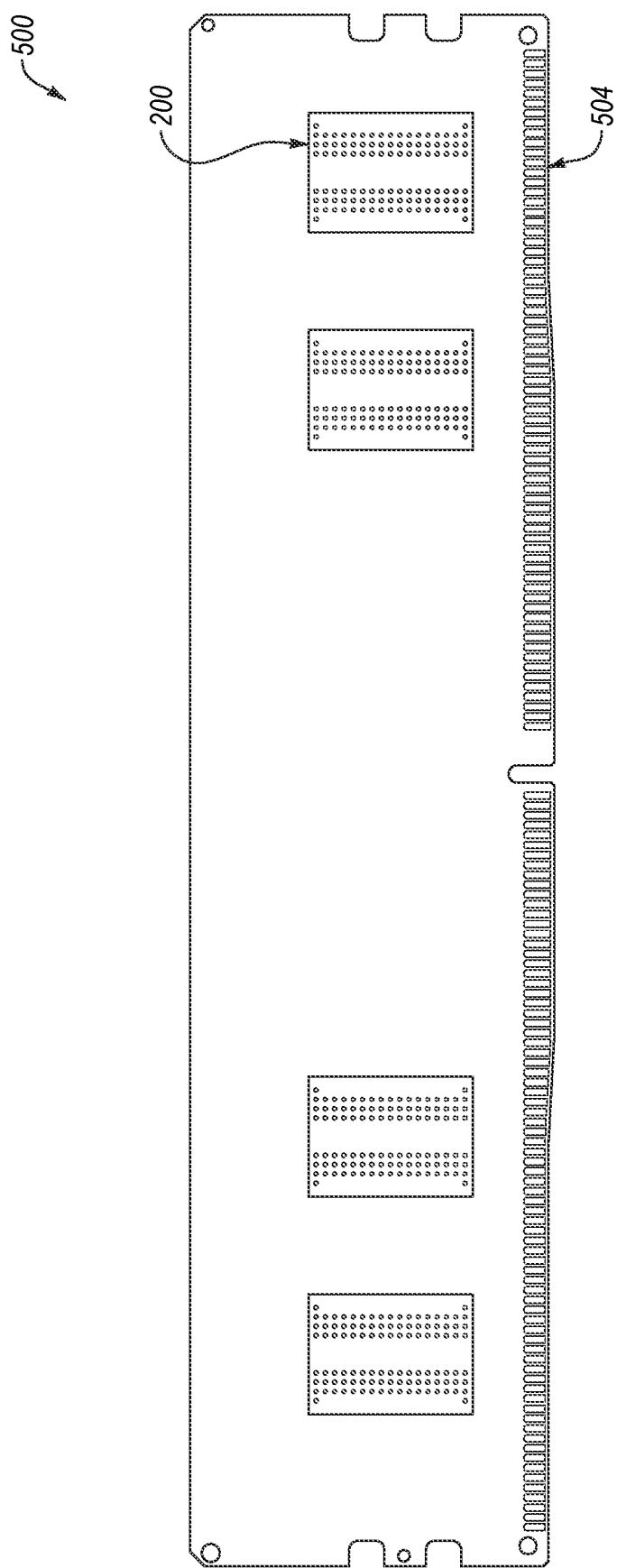
FIG. 5 shows a schematic diagram of a memory module including multiple memory devices according to one or more embodiments of the disclosure.

FIG. 5 is a schematic diagram of a memory module 500 (e.g., a RAM integrated circuit) including a plurality of the memory devices 200 of FIG. 2. For example, the memory module may include a double data rate (DDR) fifth generation Synchronous Dynamic Random-Access Memory (DDR5 SDRAM), and each of the memory device 200 may include a DRAM. The memory module 500 may further include a plurality of input/output pins 504. In embodiments include unregistered memory, each of the memory devices 200 may include a respective line (e.g., connection) that is configured to electrically connect directly to a memory controller (e.g., a memory controller of the module or a motherboard), such that the memory controller may control (e.g., drive) each of the memory devices 200. The lines (e.g., connections) may be operably coupled to one or more of the plurality of input/output pins 504. In embodiments including registered memory (e.g., buffered memory), the memory module 500 may include a register or buffer chip between the memory devices 200 and the memory controller.

Figure 6:
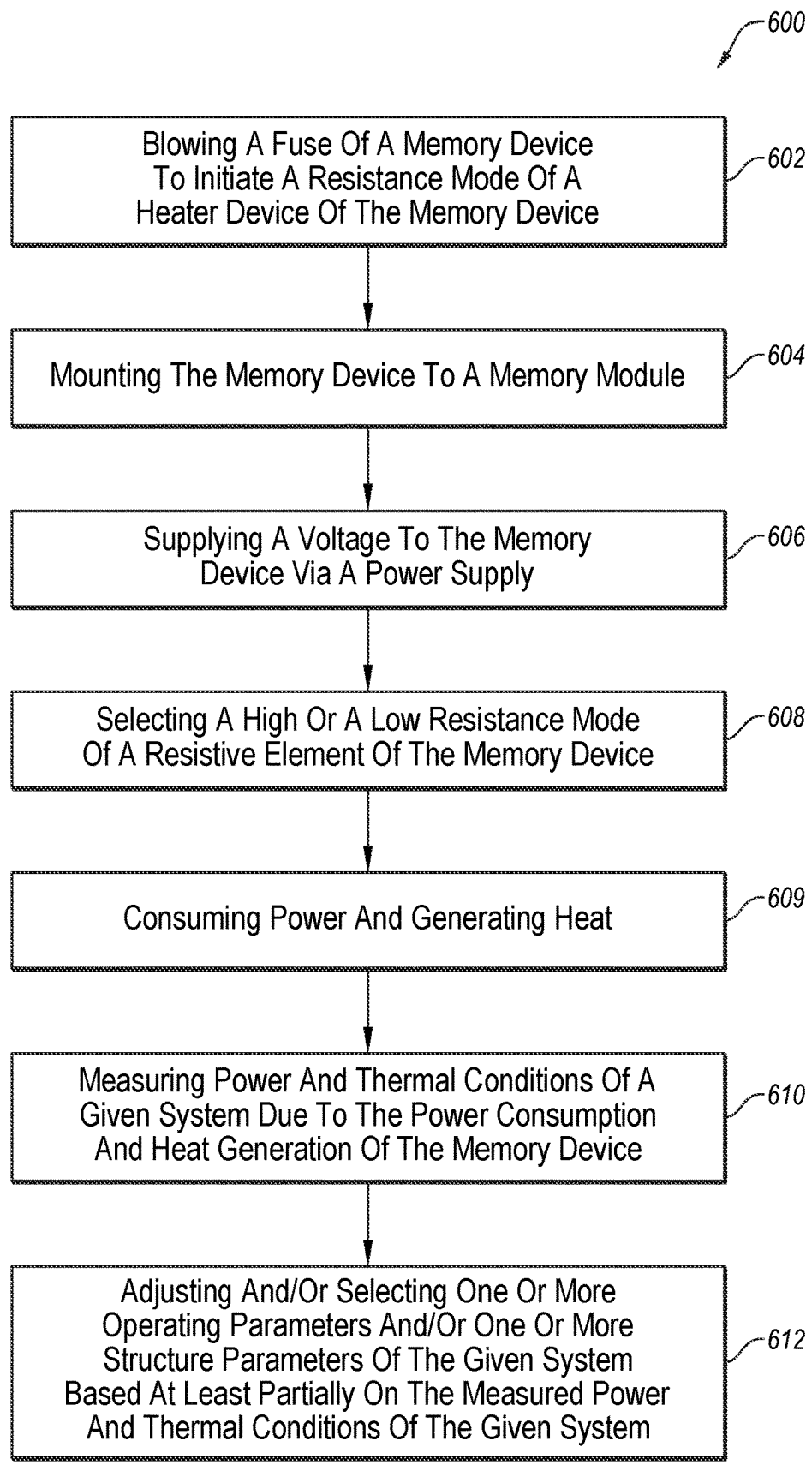
FIG. 6 is a flow chart of a method of emulating power and thermal operating conditions of a system and, optionally, measuring power and thermal operating conditions of a system according to one or more embodiments of the disclosure.

FIG. 6 depicts flow chart of a method 600 of emulating power and thermal operating conditions of a system and, optionally, measuring power and thermal operating conditions of a system according to one or more embodiments of the disclosure. In some embodiments, the method 600 may include blowing a fuse of a memory device 200 to initiate a resistance mode of a heater device 104 of the memory device 200, as shown in act 602 of FIG. 6. For example, blowing the fuse of the memory device 200 may include applying a direct current pulse of a relatively high current (e.g., 10 mA) to blow (e.g., open) the fuse. For instance, the fuse may have two logic states including a first state as a logical "zero" and a second state (e.g., programmed state) as a logical "one" where the fuse yields a high resistance or an open circuit. Additionally, blowing the fuse of the memory device 200 may include blowing the fuse through any conventional manner. Blowing the fuse (e.g., creating a high resistance or open circuit) of the memory device 200 may direct any power supplied by a power supply 210 (e.g., $V_{DD}$) to a resistive element 204 (e.g., a lower resistance), when the memory device 200 is coupled (e.g., mounted) to a memory module (e.g., memory module 400). In some embodiments, blowing the fuse of the memory device 200 may include blowing the fuse of a first switch element (e.g., first switch element 206) of the memory device 200 via any of the manners described above in regard to FIG. 2.

In some embodiments, the method 600 may optionally include mounting the memory device 200 to a memory module (e.g., memory modules 400, 500), as shown in act 604 of FIG. 6. For example, in some embodiments, the method 600 may include blowing a fuse of the memory device 200 prior to mounting the memory device 200 (e.g., DRAM) to a memory module (e.g., DDR4). As is discussed in greater detail below, blowing a fuse of the memory device 200 prior to mounting the memory device 200 may enable the memory device 200 to be sold as individual components that later can be mounted to the memory module. The memory device 200 may be mounted to the memory module via any conventional method.

The method 600 may further include, responsive to blowing the fuse of the memory device 200 and initiating a resistance mode of the heater device 104 of the memory device 200, supplying a voltage to the memory device 200 via the power supply 210 (e.g., powering on the memory device 200), as shown in act 606 of FIG. 6. For example, the method 600 may include applying an input voltage to the memory device 200. In some embodiments, the input voltage may be within a range of about 0.8 V and about 2.5V, and the input voltage may be selected based at least partially on a type of memory device 200 (e.g., DRAM, NAND, NOR) and a type of memory module (e.g., DDR4, DDR5, etc.). Additionally, the input voltage may be selected based at least partially on a power mode (e.g., an active power mode or a standby power mode) of the memory device 200 to be emulated. Moreover, in some embodiments, the input voltage may be changed (e.g., toggled) to emulate differing operating conditions. Furthermore, as noted above, because the fuse of the memory device 200 was blown (e.g., blown, essentially creating an open circuit with a die of the memory device 200), the voltage may be applied (e.g., directed) to the resistive element 204 of the memory device 200.

Additionally, the method 600 may include selecting a high or a low resistance mode of the resistive element 204 of the memory device 200, as show in act 608 of FIG. 6. For example, the method 600 may include selecting whether to apply the input voltage across a first resistor (e.g., first resistor 214) or a second resistor (e.g., second resistor 216). In some embodiments, selecting the high resistance mode or the low resistance mode may include inputting one or more of an MRS command or a chip (e.g., pin) select command to a switch (e.g., the second switch element 208) of the memory device 200 in order to apply the input voltage across the selected resistor. For instance, the method 600 may include generating and sending one or more MRS commands and/or chip (e.g., pin) select commands to the memory device 200 to select one of the first resistor 214 or the second resistor 216 via the switch (e.g., create a circuit with the selected resistor). In one or more embodiments, selecting the high resistance mode or the low resistance mode may be performed via any of the manners described above in regard to FIG. 2 and operating the second switch element 208.

In one or more embodiments, selecting the high or the low resistance mode of the resistive element 204 of the memory device 200 may include switching between the high resistance mode and the low resistance mode while at least substantially continuously supplying a voltage to the memory device 200. In other words, selecting the high or the low resistance mode of the resistive element 204 of the memory device 200 may include toggling back and forth between the high resistance mode and the low resistance mode to emulate active power modes and standby power modes for a period of time sufficient to obtain reliable data, stress test other components of the system, or both.

In some embodiments, selecting the high resistance mode or the low resistance mode may be at least partially dependent on an anticipated power draw during operation of the memory device 200 (e.g., an anticipated amount of power to be consumed during operation of the memory device 200) within a given system. Furthermore, the anticipated power draw may be determined based at least partially on an anticipated processing load of the memory device 200 with the given system. For example, in some embodiments, the power draw may be within a range of about 100 milliwatts (mW) and about 500 milliwatts (mW). Accordingly, a resistance (e.g., the resistor) may be selected to at least substantially emulate an anticipated power draw (e.g., operating conditions) of the memory device 200.

Responsive to applying the input voltage across the resistive element 204 (i.e., either the first resistor 214 or the second resistor 216 of the resistive element 204), the heater device 104 may consume power and may generate heat, as shown in act 609. Accordingly, in some embodiments, the method 600 may optionally include measuring power and thermal conditions of the given system due to the power consumption and heat generation of the memory device 200, as shown in act 610 of FIG. 6. For example, the method 600 may include measuring temperatures around the memory device 200 when subjected to airflow (e.g., a fan providing airflow over or around the memory device 200) and consuming a selected power amount. In some embodiments, the method 600 may include measuring temperatures around the memory device 200 when subjected to range of airflows and consuming a range of selected power amounts. In one or more embodiments, the method 600 may include measuring temperatures around a plurality of memory devices 200 or a plurality of memory modules having memory device 200 when oriented proximate to each other, subjected to airflow or a range of airflows, and consuming a selected power amount or range of power amounts. Additionally, system designers may measure inlet versus outlet airflow to verify adequate airflow and analyze performance of other components/systems of the system upstream and/or downstream from the memory device 200. In further embodiments, the method 600 may include measuring effects of the memory device 200 drawing a selected power amount on other components of the given system.

Additionally, in one or more embodiments, the method 600 may include adjusting and/or selecting one or more operating parameters and/or one or more structural parameters of the given system based at least partially on the measured power and thermal conditions of the given system, as shown in act 612 of FIG. 6. For example, the method 600 may include selecting an airflow amount to produce, a direction of air flow to produce, a fan speed of one or more fans to include, and/or number of fans to include within the given system, or a number, configuration and location of one or more heat sinks based at least partially on the measured power and thermal conditions of the given system. Furthermore, the method 600 may include selecting an inlet temperature to ensure that the system, a data center, and/or an environment has adequate cooling capability. Additionally, the method 600 may include selecting and/or altering distances between adjacent memory modules and/or distances between memory modules and other structures of the system based at least partially on the measured power and thermal conditions of the given system.

Figure 7:
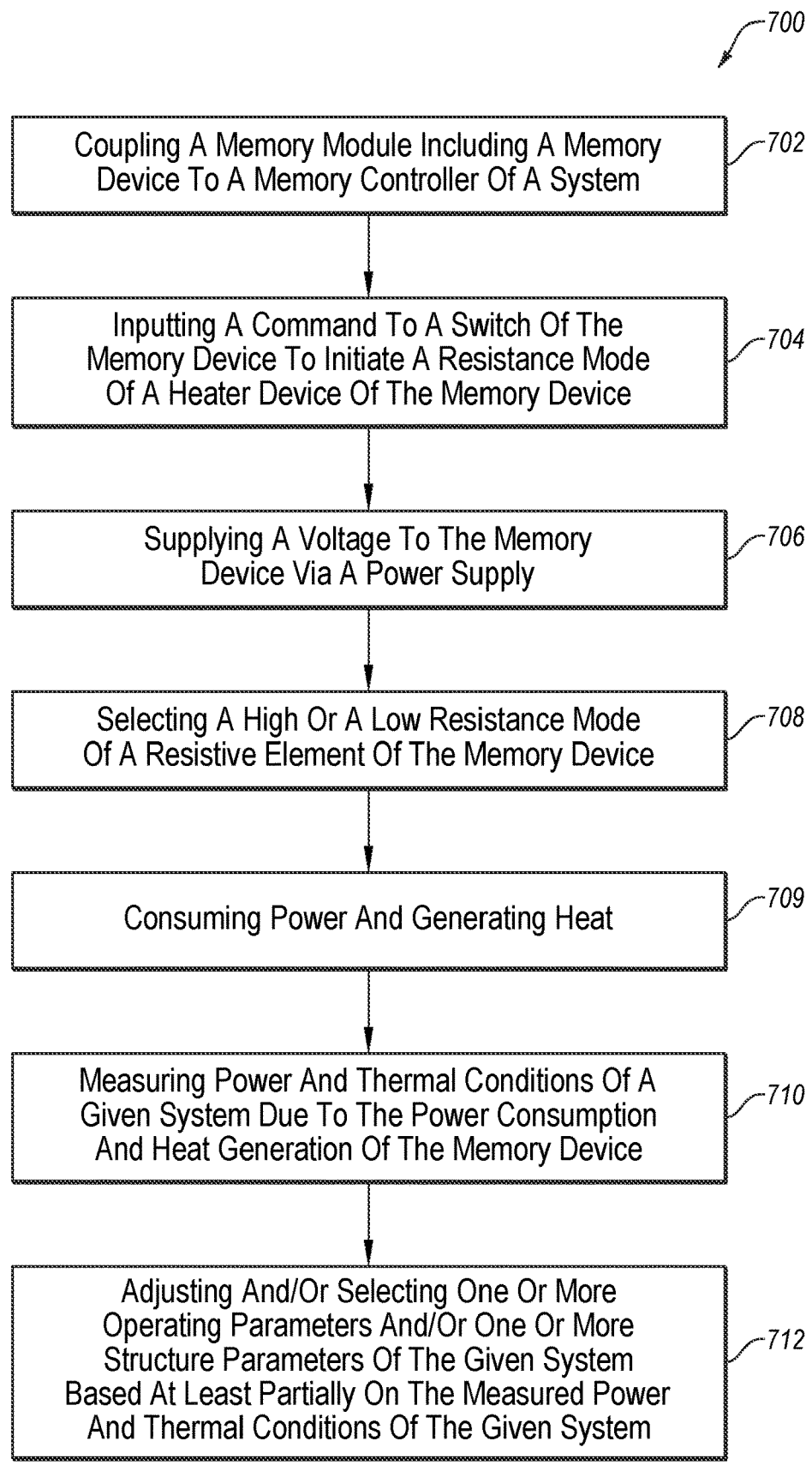
FIG. 7 is a flow chart of a method of emulating power and thermal operating conditions of a system and, optionally, measuring power and thermal operating conditions of a system according to one or more embodiments of the disclosure.

FIG. 7 depicts flow chart of a method 700 of emulating power and thermal operating conditions of a system and, optionally, measuring power and thermal operating conditions of the system according to one or more embodiments of the disclosure. In some embodiments, the method 700 may include coupling a memory module including a memory device 200 (e.g., at least one memory device) to a memory controller of the system, as shown in act 702 of FIG. 7. For instance, the method 700 may include coupling a double data rate (DDR) module including one or more DRAMs to a motherboard of a system.

Additionally, the method 700 may include transmitting a command to a switch (e.g., the first switch 206) of a heater device (e.g., heater device 104) of the at least one memory device 200 to initiate a resistance mode of the heater device 104, as shown in act 704 of FIG. 7. For example, the method 700 may include writing an MRS command to the memory device 200 to create an open circuit with a die of the memory device 200 and to couple a power supply 210 of the system to a resistive element 204 of the heater device 104 of the memory device 200 via a power supply connection 211. For instance, the method 700 may include writing an MRS command to the memory device 200 to configure (e.g., flip) the switch to couple the power supply 210 of the system to the resistive element 204 of the heater device 104 of the memory device 200 via the power supply connection 211.

The method 700 may further include supplying a voltage to the memory device 200 via the power supply 210 (e.g., powering on the memory device 200), as shown in act 706 of FIG. 7. For example, the method 700 may include applying an input voltage to the memory device 200. In some embodiments, the input voltage may be within a range of about 0.8 V and about 2.5V, and the input voltage may be selected based at least partially on a type of memory device 200 (e.g., DRAM, NAND, NOR) and a type of memory module (e.g., DDR4, DDR5, etc.). Additionally, the input voltage may be selected based at least partially on a power mode (e.g., an active power mode or a standby power mode) of the memory device 200 to be emulated. Moreover, in some embodiments, the input voltage may be changed (e.g., toggled) to emulate differing operating conditions. Furthermore, as noted above, because the MRS command initiated a resistance mode of the memory device 200, the input voltage may be applied (e.g., directed) to the resistive element 204 of the memory device 200.

Additionally, the method 700 may include selecting a high or a low resistance mode of the resistive element 204 of the memory device 200, as show in act 708 of FIG. 7. For example, the method 700 may include selecting whether to apply the input voltage across a first resistor (e.g., first resistor 214) or a second resistor (e.g., second resistor 216). In some embodiments, selecting the high resistance mode or the low resistance mode may include inputting one or more of an MRS command or a chip (e.g., pin) select command to a switch (e.g., the second switch element 208) of the memory device 200 in order to apply the input voltage across the selected resistor. For instance, the method 700 may include generating and sending one or more MRS commands and/or chip (e.g., pin) select commands to the memory device 200 to select one of the first resistor 214 or the second resistor 216 via the switch (e.g., create a circuit with the selected resistor). In one or more embodiments, selecting the high resistance mode or the low resistance mode may be performed via any of the manners described above in regard to FIG. 2 and operating the second switch element 208.

In one or more embodiments, selecting the high or the low resistance mode of the resistive element 204 of the memory device 200 may include switching between the high resistance mode and the low resistance mode while at least substantially continuously supplying a voltage to the memory device 200. In other words, selecting the high or the low resistance mode of the resistive element 204 of the memory device 200 may include toggling back and forth between the high resistance mode and the low resistance mode to emulate active power modes and standby power modes.

In some embodiments, as noted above, selecting the high resistance mode or the low resistance mode may be at least partially dependent on an anticipated power draw during operation of the memory device 200 (e.g., an anticipated amount of power to be consumed during operation of the memory device 200) within a given system. Furthermore, the anticipated power draw may be determined based at least partially on an anticipated processing load of the memory device 200 with the given system. For example, in some embodiments, the power draw may be within a range of about 100 milliwatts (mW) and about 500 milliwatts (mW). Accordingly, a resistance (e.g., the resistor) may be selected to at least substantially emulate an anticipated power draw (e.g., operating conditions) of the memory device 200.

Responsive to applying the input voltage across the resistive element 204 (i.e., either the first resistor 214 or the second resistor 216 of the resistive element 204), the heater device 104 may consume power and may generate heat, as shown in act 709 of FIG. 7. Accordingly, in some embodiments, similar to method 600, the method 700 may optionally include measuring power and thermal conditions of the given system due to the power consumption of the memory device 200, as shown in act 710 of FIG. 7. For example, the method 700 may include measuring any of the power and thermal conditions discussed above in regard to FIGS. 1-6.

Additionally, in one or more embodiments, the method 700 may include adjusting and/or selecting one or more operating parameters and/or one or more structure parameters of the given system based at least partially on the measured power and thermal conditions of the given system, as shown in act 712 of FIG. 7. For example, act 712 of FIG. 7 may include any of the actions described above in regard to act 612 of the method 600.

The memory devices and heater devices of embodiments of the disclosure may provide advantages over conventional methods for attempting to emulate thermal operating conditions of systems (e.g., desktops, laptops, servers). For instance, unlike heater die that are utilized in wind tunnels and are not connectable to a given system, the memory devices of the disclosure include system ready components. For example, the memory devices are ready to be coupled to a memory module and memory controller (e.g., a motherboard) and utilized with a system (e.g., a desktop computer). Put another way, the memory device are configured as a "plug and play" component for testing purposes. Furthermore, the heater device may enable an operator of the system to temporarily turn the memory device into a resistive element, provide power to the resistive element, and readily test power and thermal operating conditions of the system without requiring a complete system or even a certain memory controller to be available. Furthermore, the heater device 104 may emulate the power and thermal conditions of the system prior to having a complete system or having particular memory controllers or other components available to control processing functions. For example, the heater device 104 may enable operators and/or systems to emulate power and thermal operating conditions when the operators and/or the systems do not have sufficient infrastructure in place to access and/or drive processing functions of the memory device 200 (e.g., the die of the memory device) but still want to test power and thermal operating condition. Moreover, the heater device 104 of the memory device 100 permits power conditions and thermal conditions of the system to be emulated and tested without requiring additional software or testing systems. Therefore, the power and thermal conditions of the system can be measured and tested on site by the operators of the system. Moreover, the heater device of the memory device permits an operator to adjust (e.g., fine tune) operating parameters (e.g., fan speeds, airflow, etc.) and/or structure of the system based on the emulated power and thermal conditions without having a complete system and/or prior to having a fully functioning system.

Additionally, because the memory devices may be fabricated to include the heater devices, the memory devices may be produced and sold as individual components that may be coupled to memory module substrates or other higher-level packaging. Alternatively, the memory devices may be coupled to substrates to provide test memory modules and then sold. Moreover, in comparison to conventional heater die utilized in wind tunnels, the memory devices and heater devices provide a testing method to utilize native voltages to initiate the testing methods.

While embodiments of the disclosure have been described in the context of memory devices, those of ordinary skill in the art will recognize and appreciate that other microelectronic devices (i.e., semiconductor die and assemblies of same) may incorporate or be associated with heater devices. For example, heater devices may be incorporated in or associated with logic devices configured as controllers, microprocessor devices, graphics processing units (GPUs) and application specific integrated circuits (ASICs) incorporating processor and memory functionalities. Further, solid state device (SSD) memory in the form of, for example, NAND flash or 3D Xpoint memory may be configured with heater device-equipped memory die and a dummy controller for test purposes to emulate power and heat effects of a live SSD. Of course, SSD equipped with other memory configurations may also be equipped with heater devices. For emulating operational thermal and power conditions of any multi-die module, it is contemplated that each die of the module will be equipped with either an integral heater device or an ancillary heating device operably couple to that die.

Some embodiments of the disclosure include a memory device. The memory device may include at least one die, and a heater device located on or in the at least one die. The heater device may include a first switch element electrically connected to a power supply connection and the at least one die, a second switch element electrically connected to the first switch element, and a resistive element electrically connect to the second switch element and a ground connection.

One or more embodiments of the disclosure may include a memory module. The memory module may include multiple memory devices operably coupled to a substrate. Each memory device may include at least one die and a heater device operably coupled to the at least one die. The heater device may include a first switch element electrically connected to a power supply connection of the substrate and the at least one die, a second switch element electrically connected to the first switch element, and a resistive element electrically connected to the second switch element and a ground connection of the substrate.

Embodiments of the disclosure may include a method including configuring a first switching element of a heater device of a memory device to electrically connect a second switching element of the heater device to a power supply connection, configuring the second switching element of the heater device to electrically connect one of a first resistor or a second resistor of a resistive element of the heater device to the first switching element, and applying an voltage to the memory device and across the first resistor or the second resistor of the resistive element that is electrically connected to the first switching element.

Some embodiments of the disclosure include a heater device of a memory device. The heater device may include a first switch element electrically connected to a power supply connection of the heater device and configured to electrically connect at least one die of the memory device to the power supply connection, a second switch element electrically connected to the first switch element, and a resistive element electrically connected to the second switch element and a ground connection of the memory device.

Embodiments of the disclosure further include:

Embodiment 1. A memory device, comprising: at least one die; and a heater device located on or in the at least one die, the heater device comprising: a first switch element electrically connected to a power supply connection and the at least one die; a second switch element electrically connected to the first switch element; and a resistive element electrically connected to the second switch element and a ground connection.

Embodiment 2. The memory device of embodiment 1, wherein the resistive element comprises: at least one first resistor having a first resistance; and at least one second resistor having a second, different resistance.

Embodiment 3. The memory device of embodiment 2, wherein one or more of the at least one first resistor and the at least one second resistor comprises polycrystalline silicon or an electrically resistive metal material.

Embodiment 4. The memory device of any one of embodiments 2 and 3, wherein the at least one first resistor has a resistance of about 4.0 ohms ($\Omega$) and the at least one second resistor has a resistance of about 24 ohms ($\Omega$).

Embodiment 5. The memory device of any one of embodiments 2-4, wherein the second switch element is configured to switch between electrically connecting the at least one first resistor to the first switch element and connecting the at least one second resistor to the first switch element.

Embodiment 6. The memory device of any one of embodiments 1-5, wherein the resistive element comprises more than two different resistors having differing resistances.

Embodiment 7. The memory device of any one of embodiments 1-6, wherein the first switch element is configured to switch between electrically connecting the at least one die to the power supply connection and connecting the second switch element to the power supply connection.

Embodiment 8. The memory device of any one of embodiments 1-7, wherein the heater device is located on or in an active surface of the at least one die peripheral to a memory array of the at least one die.

Embodiment 9. The memory device of any one of embodiments 1-8, wherein the heater device is separate and discrete from the at least one die in a redistribution layer (RDL) or an interposer operably coupled to the at least one die.

Embodiment 10. The memory device of any one of embodiments 1-9, wherein the memory device comprises one or more of DRAM, NAND, or NOR die.

Embodiment 11. The memory device of any one of embodiments 1-10, wherein the first switch element comprises a fuse and a fuse device configured to selectively blow the fuse.

Embodiment 12. The memory device of any one of embodiments 1-11, wherein the first switch element comprises switching circuitry configured to be operated via one or more of an MRS command or a chip select command.

Embodiment 13. The memory device of any one of embodiments 1-12, wherein the second switch element comprises switching circuitry configured to be operated via one or more of an MRS command or a chip select command.

Embodiment 14. A memory module, comprising: multiple memory devices operably coupled to a substrate, each memory device comprising: at least one die; and a heater device operably coupled to the at least one die, the heater device comprising: a first switch element electrically connected to a power supply connection of the substrate and the at least one die; a second switch element electrically connected to the first switch element; and a resistive element electrically connected to the second switch element and a ground connection of the substrate.

Embodiment 15. The memory module of embodiment 14, wherein the resistive element of each of the memory devices comprises: at least one first resistor exhibiting a first resistance; and at least one second resistor exhibiting a second, different resistance.

Embodiment 16. The memory module of embodiment 15, wherein the at least one first resistor exhibits a resistance of about 4.0 ohms ($\Omega$) and the at least one second resistor exhibits a resistance of about 24 ohms ($\Omega$).

Embodiment 17. The memory module of any one of embodiments 15 and 16, wherein the second switch element is configured to switch between electrically connecting the at least one first resistor to the first switch element and connecting the at least one second resistor to the first switch element.

Embodiment 18. The memory module of any one of embodiments 14-17, wherein the first switch element is configured to switch between electrically connecting the at least one die to the power supply connection of the substrate and connecting the second switch element to the power supply connection of the substrate.

Embodiment 19. The memory module of any one of embodiments 14-18, wherein the heater device is located on or within an active surface of the at least one die.

Embodiment 20. The memory module of any one of embodiments 14-19, wherein the heater device is located in a redistribution layer (RDL) or interposer operably coupled to the at least one die.

Embodiment 21. The memory module of any one of embodiments 14-20, wherein the memory device comprises one or more of DRAM, NAND, or NOR die.

Embodiment 22. The memory module of any one of embodiments 14-21, wherein the first switch element comprises a fuse and a fuse device configured to selectively open the fuse.

Embodiment 23. The memory module of any one of embodiments 14-22, wherein the first switch element comprises switching circuitry configured to be controlled by one or more of an MRS command or a chip select command.

Embodiment 24. The memory module of any one of embodiments 14-23, wherein the second switch element comprises switching circuitry configured to be operated by one or more of an MRS command or a chip select command.

Embodiment 25. A method comprising: configuring a first switching element of a heater device of a memory device to electrically connect a second switching element of the heater device to a power supply connection; configuring the second switching element of the heater device to electrically connect one of a first resistor or a second resistor of a resistive element of the heater device to the first switching element; and applying a voltage to the memory device and across the first resistor or the second resistor of the resistive element electrically connected to the first switching element.

Embodiment 26. The method of embodiment 25, wherein applying the voltage to the memory device comprises toggling between voltage values to alternatively emulate a standby power draw of the memory device and an active power draw of the memory device.

Embodiment 27. The method of any one of embodiments 25 and 26, wherein configuring the first switching element of the heater device of the memory device to electrically connect the second switch element of the heater device to the power supply connection comprises blowing a fuse of the first switching element.

Embodiment 28. The method of any one of embodiments 25-27, wherein configuring the first switching element of the heater device of the memory device to electrically connect the second switch element of the heater device to the power supply connection comprises inputting one or more of an MRS command or a chip select command.

Embodiment 29. The method of any one of embodiments 25-28, wherein configuring the second switching element of the heater device to electrically connect one of the first resistor or the second resistor of the resistive element of the heater device to the first switching element comprises inputting one or more of an MRS command or a chip select command.

Embodiment 30. The method of any one of embodiments 25-29, further comprising mounting the memory device to a substrate of a memory module after configuring the first switching element and prior to configuring the second switching element.

Embodiment 31. The method of any one of embodiments 25-30, further comprising, responsive to applying the voltage, measuring one or more operating conditions of a system within which the memory device is installed.

Embodiment 32. The method of embodiment 31, further comprising adjusting one or more of an operating parameter or a design of the system based at least partially on the measured one or more operating conditions of the system.

Embodiment 33. A heater device of a memory device, comprising: a first switch element electrically connected to a power supply connection of the heater device and configured to electrically connect at least one die of the memory device to the power supply connection; a second switch element electrically connected to the first switch element; and a resistive element electrically connected to the second switch element and a ground connection of the memory device.

Embodiment 34. The heater device of embodiment 33, wherein the resistive element comprises: at least one first resistor; and at least one second resistor having a different resistance from a resistance of the first resistor.

Embodiment 35. The heater device of embodiment 34, wherein the second switch element is configured to switch between electrically connecting the at least one first resistor to the first switch element and connecting the at least one second resistor to the first switch element.

Embodiment 36. The heater device of any one of embodiments 34 and 35, wherein the first switch element is configured to switch between electrically connecting the at least one die to the power supply connection and connecting the second switch element to the power supply connection.

Embodiment 37. The heater device of any one of embodiments 33-36, wherein the first switch element comprises a fuse and a fuse device adapted to selectively open the fuse.

Embodiment 38. The heater device of any one of embodiments 33-37, wherein the first switch element comprises switching circuitry configured to be operated via one or more of an MRS command or a chip select command.

Embodiment 39. The heater device of any one of embodiments 33-38, wherein the second switch element comprises switching circuitry configured to be operated via one or more of an MRS command or a chip select command.

Embodiment 40. A semiconductor structure, comprising: at least one wafer; and a heater device located on or in the at least one wafer, the heater device comprising: a first switch element electrically connected to a power supply connection and the at least one wafer; a second switch element electrically connected to the first switch element; and a resistive element electrically connected to the second switch element and a ground connection.

Embodiment 41. The semiconductor structure of embodiment 40, wherein the resistive element comprises: at least one first resistor having a first resistance; and at least one second resistor having a second, different resistance.

Embodiment 42. The semiconductor structure of embodiment 41, wherein one or more of the at least one first resistor and the at least one second resistor comprises polycrystalline silicon or an electrically resistive metal material.

Embodiment 43. The semiconductor structure of embodiment 41, wherein the second switch element is configured to switch between electrically connecting the at least one first resistor to the first switch element and connecting the at least one second resistor to the first switch element.

Embodiment 44. The semiconductor structure of any one of embodiments 40-43, wherein the resistive element comprises more than two different resistors having differing resistances.

While the disclosure has been described herein with respect to certain illustrated embodiments, those of ordinary skill in the art will recognize and appreciate that it is not so limited. Rather, many additions, deletions, and modifications to the illustrated embodiments may be made without departing from the scope of the invention as claimed, including legal equivalents thereof. In addition, features from one embodiment may be combined with features of another embodiment while still being encompassed within the scope of the disclosure as contemplated by the inventors. Further, embodiments of the disclosure have utility with different and various tool types and configurations.

What is claimed is:

1. A memory device, comprising:
   at least one die; and
   a heater device located on or in the at least one die, the heater device comprising:
   a first switch element electrically connected to a power supply connection and the at least one die;
   a second switch element electrically connected to the first switch element; and
   a resistive element electrically connected to the second switch element and a ground connection,
   wherein the first switch element is configured to switch between electrically connecting the at least one die to the power supply connection and connecting the second switch element to the power supply connection.

2. The memory device of claim 1, wherein the resistive element comprises:
   at least one first resistor having a first resistance; and
   at least one second resistor having a second, different resistance.

3. The memory device of claim 2, wherein one or more of the at least one first resistor and the at least one second resistor comprises polycrystalline silicon or an electrically resistive metal material.

4. The memory device of claim 2, wherein the at least one first resistor has a resistance of about 4.0 ohms ($\Omega$) and the at least one second resistor has a resistance of about 24 ohms ($\Omega$).

5. The memory device of claim 2, wherein the second switch element is configured to switch between electrically connecting the at least one first resistor to the first switch element and connecting the at least one second resistor to the first switch element.

6. The memory device of claim 1, wherein the resistive element comprises more than two different resistors having differing resistances.

7. The memory device of claim 1, wherein the heater device is located on or in an active surface of the at least one die peripheral to a memory array of the at least one die.

8. The memory device of claim 1, wherein the heater device is separate and discrete from the at least one die in a redistribution layer (RDL) or an interposer operably coupled to the at least one die.

9. The memory device of claim 1, wherein the memory device comprises one or more of DRAM, NAND, or NOR die.

10. The memory device of claim 1, wherein the first switch element comprises a fuse and a fuse device configured to selectively blow the fuse.

11. The memory device of claim 1, wherein the first switch element comprises switching circuitry configured to be operated via one or more of an MRS command or a chip select command.

12. The memory device of claim 1, wherein the second switch element comprises switching circuitry configured to be operated via one or more of an MRS command or a chip select command.

13. A memory module, comprising:
    multiple memory devices operably coupled to a substrate, each memory device comprising:
    at least one die; and
    a heater device operably coupled to the at least one die, the heater device comprising:
    a first switch element electrically connected to a power supply connection of the substrate and the at least one die;
    a second switch element electrically connected to the first switch element; and
    a resistive element electrically connected to the second switch element and a ground connection of the substrate,
    wherein the first switch element is configured to switch between electrically connecting the at least one die to the power supply connection of the substrate and connecting the second switch element to the power supply connection of the substrate.

14. The memory module of claim 13, wherein the resistive element of each of the memory devices comprises:
    at least one first resistor exhibiting a first resistance; and
    at least one second resistor exhibiting a second, different resistance.

15. The memory module of claim 14, wherein the at least one first resistor exhibits a resistance of about 4.0 ohms ($\Omega$) and the at least one second resistor exhibits a resistance of about 24 ohms ($\Omega$).

16. The memory module of claim 14, wherein the second switch element is configured to switch between electrically connecting the at least one first resistor to the first switch element and connecting the at least one second resistor to the first switch element.

17. The memory module of claim 13, wherein the heater device is located on or within an active surface of the at least one die.

18. The memory module of claim 13, wherein the heater device is located in a redistribution layer (RDL) or interposer operably coupled to the at least one die.

19. The memory module of claim 13, wherein each memory device comprises one or more of DRAM, NAND, or NOR die.

20. The memory module of claim 13, wherein the first switch element comprises a fuse and a fuse device configured to selectively open the fuse.

21. The memory module of claim 13, wherein the first switch element comprises switching circuitry configured to be controlled by one or more of an MRS command or a chip select command.

22. The memory module of claim 13, wherein the second switch element comprises switching circuitry configured to be operated by one or more of an MRS command or a chip select command.

23. A method comprising:
    configuring a first switching element of a heater device of a memory device to selectively switch between electrically connecting a second switching element of the heater device to a power supply connection and electrically connecting at least one die to the power supply connection;
    configuring the second switching element of the heater device to electrically connect one of a first resistor or a second resistor of a resistive element of the heater device to the first switching element, the second resistor having a different resistance from a resistance of the first resistor; and
    applying a voltage to the memory device and across the first resistor or the second resistor of the resistive element electrically connected to the first switching element.

24. The method of claim 23, wherein applying the voltage to the memory device comprises toggling between voltage values to alternatively emulate a standby power draw of the memory device and an active power draw of the memory device.

25. The method of claim 23, wherein configuring the first switching element of the heater device of the memory device to selectively switch between electrically connecting the second switch element of the heater device to the power supply connection and electrically connecting the at least one die to the power supply connection comprises blowing a fuse of the first switching element.

26. The method of claim 23, wherein configuring the first switching element of the heater device of the memory device to selectively switch between electrically connecting the second switch element of the heater device to the power supply connection and electrically connecting the at least one die to the power supply connection comprises inputting one or more of an MRS command or a chip select command.

27. The method of claim 23, wherein configuring the second switching element of the heater device to electrically connect one of the first resistor or the second resistor of the resistive element of the heater device to the first switching element comprises inputting one or more of an MRS command or a chip select command.

28. The method of claim 23, further comprising mounting the memory device to a substrate of a memory module after configuring the first switching element and prior to configuring the second switching element.

29. The method of claim 23, further comprising, responsive to applying the voltage, measuring one or more operating conditions of a system within which the memory device is installed.

30. The method of claim 29, further comprising adjusting one or more of an operating parameter or a design of the system based at least partially on the measured one or more operating conditions of the system.

31. A heater device of a memory device, comprising:
a first switch element electrically connected to a power supply connection of the heater device and configured to electrically connect at least one die of the memory device to the power supply connection;
a second switch element electrically connected to the first switch element; and
a resistive element electrically connected to the second switch element and a ground connection of the memory device, the resistive element comprising:
at least one first resistor; and
at least one second resistor having a different resistance from a resistance of the at least one first resistor,
wherein the second switch element is configured to switch between electrically connecting the at least one first resistor to the first switch element and connecting the at least one second resistor to the first switch element.

32. The heater device of claim 31, wherein the first switch element is configured to switch between electrically connecting the at least one die to the power supply connection and connecting the second switch element to the power supply connection.

33. The heater device of claim 31, wherein the first switch element comprises a fuse and a fuse device adapted to selectively open the fuse.

34. The heater device of claim 31, wherein the first switch element comprises switching circuitry configured to be operated via one or more of an MRS command or a chip select command.

35. The heater device of claim 31, wherein the second switch element comprises switching circuitry configured to be operated via one or more of an MRS command or a chip select command.

36. A semiconductor structure, comprising:
at least one wafer; and
a heater device located on or in the at least one wafer, the heater device comprising:
a first switch element electrically connected to a power supply connection and the at least one wafer;
a second switch element electrically connected to the first switch element; and
a resistive element electrically connected to the second switch element and a ground connection, the resistive element comprising:
at least one first resistor having a first resistance; and
at least one second resistor having a second, different resistance,
wherein the second switch element is configured to switch between electrically connecting the at least one first resistor to the first switch element and connecting the at least one second resistor to the first switch element.

37. The semiconductor structure of claim 36, wherein one or more of the at least one first resistor and the at least one second resistor comprises polycrystalline silicon or an electrically resistive metal material.

38. The semiconductor structure of claim 36, wherein the resistive element comprises more than two different resistors having differing resistances.

* * * * *